(12) United States Patent
Singer

(10) Patent No.: US 6,208,219 B1
(45) Date of Patent: Mar. 27, 2001

(54) BROADBAND RF CIRCUITS WITH MICROSTRIPS LAID OUT IN RANDOMLY MEANDERING PATHS

(76) Inventor: Samuel Singer, 125 Timbersprings La., Indiana, PA (US) 15701

( * ) Notice: Subject to any disclaimer, the term of this patent is extended or adjusted under 35 U.S.C. 154(b) by 0 days.

(21) Appl. No.: 09/310,839

(22) Filed: May 12, 1999

(51) Int. Cl.[7] ............................................. H01P 5/12
(52) U.S. Cl. ................................. 333/104; 333/12
(58) Field of Search ............................ 333/1, 12, 104, 333/128

(56) References Cited

U.S. PATENT DOCUMENTS

| | | | |
|---|---|---|---|
| 3,475,700 | * 10/1969 | Ertel | 333/104 |
| 3,736,534 | 5/1973 | Chaffee | 333/161 |
| 4,293,858 | 10/1981 | Hockham | 343/731 |
| 4,525,689 | * 6/1985 | Wagner et al. | 333/104 |
| 4,785,135 | * 11/1988 | Ecker et al. | 333/1 X |
| 5,285,175 | 2/1994 | Edwards | 333/109 |
| 5,357,227 | 10/1994 | Tonegawa et al. | 333/185 |
| 5,414,393 | * 5/1995 | Rose et al. | 333/1 |
| 5,471,162 | 11/1995 | McEwan | 327/92 |
| 5,481,073 | * 1/1996 | Singer et al. | 200/1 R |
| 5,559,524 | 9/1996 | Takei et al. | 343/895 |
| 5,576,671 | * 11/1996 | Agar, Jr. et al. | 333/128 |
| 5,834,990 | * 11/1998 | Hahn et al. | 333/104 X |
| 5,939,952 | * 8/1999 | Noda et al. | 333/1 |

OTHER PUBLICATIONS

Microwaves & RF, "*Design Techniques Enhance Isolation in Switch Assemblies*", R. Silverstein, 9 pp., Dec. 1997.

RF Design, "*Minimizing RF PCB Electromagnetic Emissions*", pp. 46, 48, 55, 56, Jan. 1999.

* cited by examiner

Primary Examiner—Justin P. Bettendorf
(74) Attorney, Agent, or Firm—Buchanan Ingersoll, P.C.

(57) ABSTRACT

Broadband RF circuits in which multiple circuit elements are interconnected by microstrips arranged in regular patterns on printed circuit boards have the microstrips laid out in randomly meandering paths such that adjacent paths are non-parallel and non-symmetrical about a common axis, to increase the isolation between adjacent signal paths in broadband splitters, combiners, routers, switching systems and control systems operating up to the GHz frequency range.

3 Claims, 4 Drawing Sheets

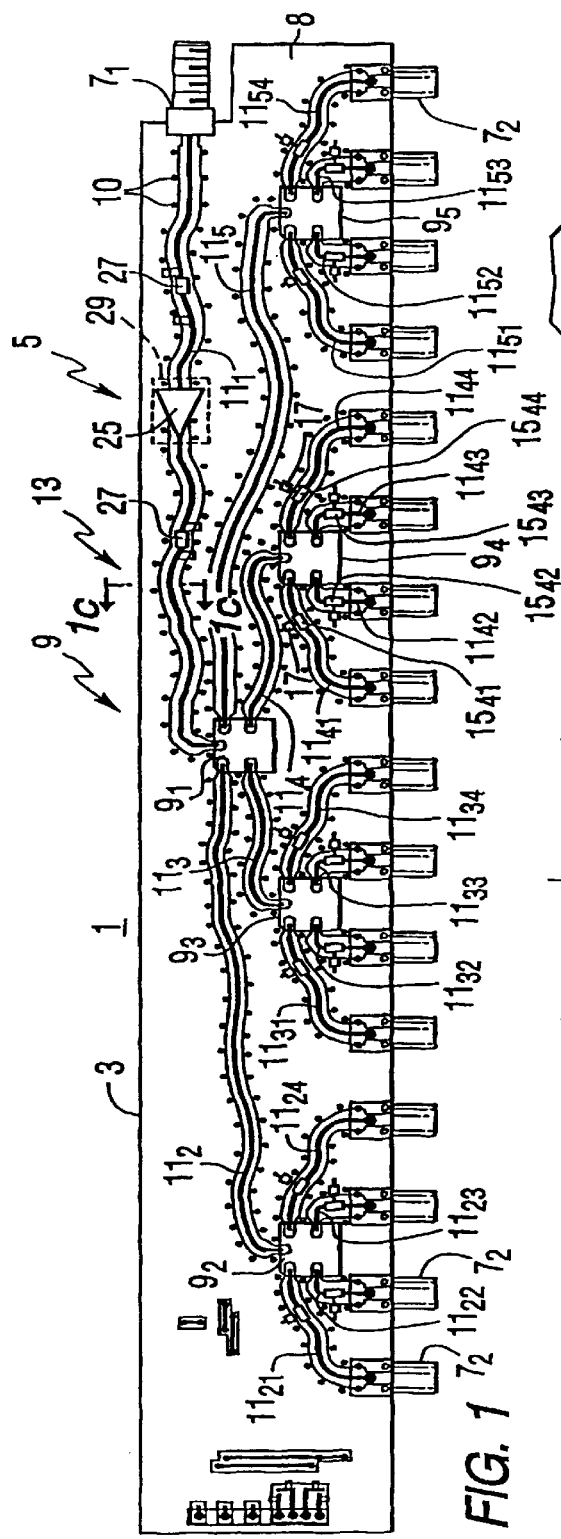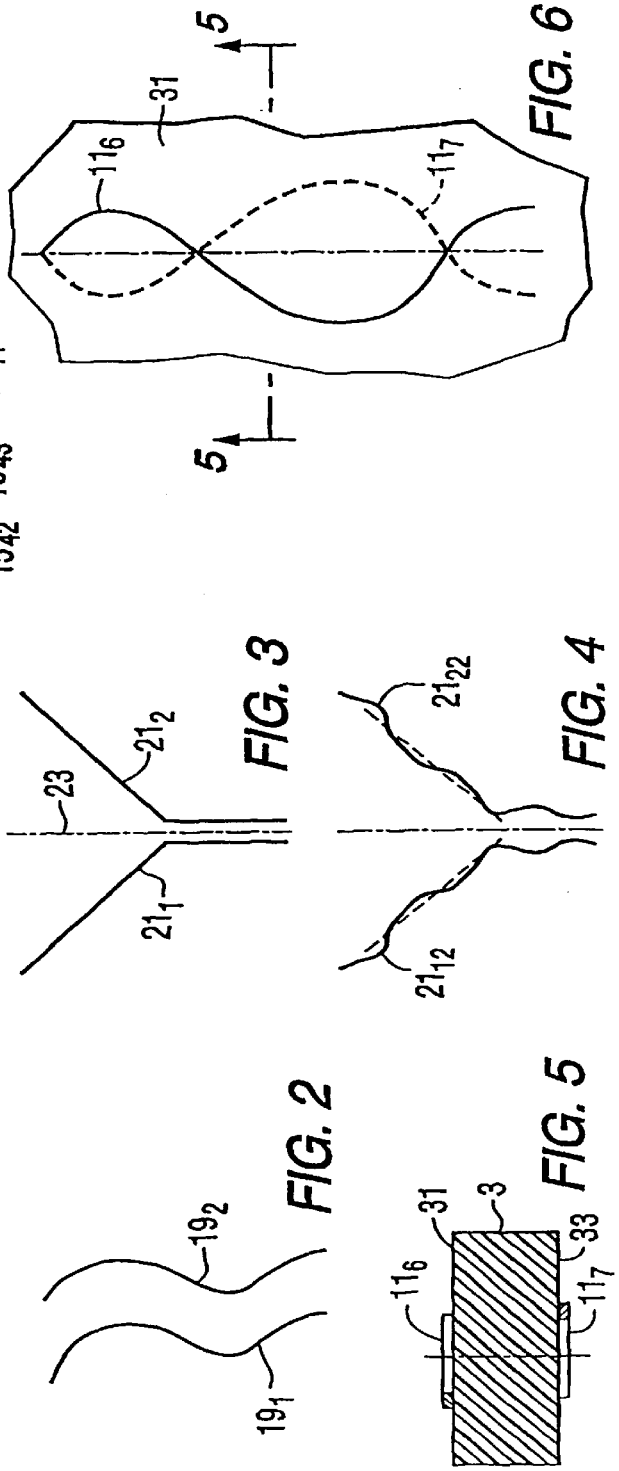
FIG. 1
FIG. 2
FIG. 3
FIG. 4
FIG. 5
FIG. 6

FIG. 1a   FIG. 1b

BROADBAND RF CIRCUITS WITH MICROSTRIPS LAID OUT IN RANDOMLY MEANDERING PATHS

BACKGROUND OF THE INVENTION

1. Field of the Invention

This invention relates to radio frequency (RF) circuits and particularly broadband RF circuits such as those used for instance in signal splitters, routers and switching matrices in multichannel systems.

2. Background Information

Typically, multiple RF signals such as television signals offered by cable television (CATV) systems have been distributed using routers made up of many branching elements such as splitters, combiners and mechanical or solid state switches interconnected by a large number of cables. Building large, multi-port routing switchers and matrix switching systems capable of operating in the upper VHF and low microwave frequencies (L-band to 2500 Mhz and beyond) requires a high concentration of splitting, switching and combining elements in limited rack space. To maintain acceptable return loss, insertion loss and isolation performance for each individual path in a "traditional" VHF or microwave switch, each circuit element, switch module and interconnecting coaxial cable has to be individually optimized for all possible (n*M) switching combinations, which is a very time consuming and expensive process, requiring technical expertise, and the outcomes are not predictable due to widely varying physical layouts and cost limitations. This process inevitably results in phasing and gainslope problems, with some paths being deficient at some frequencies over the very broad frequency bands (multi-octaves) of the intended applications.

U.S. Pat. No. 5,481,073 describes a modular broadband switching system suitable for such applications which eliminates most of the cabling by using lumped elements (5–1000 MHz) or distributed elements (above 1000 MHz) and using microstrips to interconnect the multiple branching elements mounted on printed circuit boards (PCB). The routers or matrices are assembled from transversely oriented stacks of parallel sets of such boards (stack & tier configuration). The circuit on an individual board is laid out in a candelabra pattern so that multiple branches between inputs and outputs all contain the same number of branching elements and are all of substantially the same length so that signal loss and phase of each signal in all branches are substantially the same. Initially, the switches used in these circuits were mechanical switches which provide very good isolation, e.g., 90 dB. As the performance requirements placed upon these systems increase, such as by adding data, voice and two-way internet access capability to cable services, the frequency band must be expanded up into the gigahertz range. In addition, efforts have been directed toward increasing the number and switching speed of the channels. This has lead to the use of solid state switches, such as (1*4) element GaAs switches which simultaneously reduce the total count of elements on the circuit boards, while increasing the number of circuit branches and the speed of switching. Unfortunately, these solid state switches do not provide the isolation available from mechanical switches, e.g., typically only 40 dB. This isolation can be improved by adding switches in series with each branch output to increase isolation by as much as about 20 dB at the highest frequency of operation and considerably more at the lower frequencies. Even with such tandem switching, isolation between branches remains a problem. At least 60 dB of isolation is required between any circuit paths carrying analog TV signals. I have realized that poor isolation is due in part to the virtually universal practice of laying out microstrips on circuit boards in straight lines or arcs of constant radii with adjacent lines or arcs often parallel to each other. While this practice simplifies circuit board design and renders the software used in automated design (CAD) simpler, it leads to coupling between closely spaced lines. In addition, when a signal is split between adjacent parallel lines which radiate the signal in phase, an antenna array may be created. Similarly, an antenna array can be created by two identical lines which diverge about a common axis. Where a common signal is distributed through stacks of identical parallel circuit boards the problem is compounded.

The problem is not limited to broadband multi-channel splitters, couplers, routers and matrices. As the frequency of digital processors increases into the high megahertz and gigahertz ranges the typical linear, parallel patterns of the microstrip lines on mother boards as used on computers and other advanced PCBs also leads to signal isolation difficulties.

There is a need therefore for RF circuits with improved isolation between circuit elements and reduced radiation of signals.

SUMMARY OF THE INVENTION

This need and others are satisfied by the invention which is directed to a broadband RF circuit which includes a circuit board, a number of circuit elements on the circuit board, and a plurality of microstrips on the circuit board interconnecting the circuit elements. The term microstrip as used herein refers to conductors printed, etched or machined into rigid or flexible dielectric material and an associated ground plane and includes striplines suspended between two ground planes. The microstrips are laid out in randomly meandering paths such that no two paths are parallel. By randomly meandering, it is meant that the paths change direction in an irregular and non-symmetrical fashion and have a random relationship to the wavelengths of RF signals carried by the microstrip. Each of the randomly meandering paths is non-parallel to adjacent randomly meandering paths and no two adjacent paths are symmetrical about a common axis. Such non-parallel randomly meandering paths reduce the coupling between microstrips. They also reduce the tendency of adjacent microstrips carrying the same signal to act as a multi-element antenna which would radiate the signal.

The invention has particular applicability to broadband RF circuits such as those used in multi-media routers and switching matrices. Such circuits tend to have multiple branches made up of branching elements and interconnecting microstrips which form a symmetrical pattern such as a candelabra pattern. The symmetrical patterns promote the coupling between microstrips and the creation of multiple element antennas arrays, especially where a signal is split into a number of parallel signal paths.

The invention also has particular applicability to modular broadband RF circuits where a number of the circuit boards are mounted in spaced apart parallel planes. The isolation between multiple paths and reduction of radiation of a common signal can be further enhanced in such modular circuits by having different randomly meandering paths on corresponding microstrips on adjacent boards. Where such boards are symmetrical about a central axis, the random meandering of corresponding paths on the two sides of the axis can be different so that adjacent boards can be reversed about the common axis to maintain similar circuit configurations but without having microstrips with the same random meandering of adjacent microstrips. This arrangement permits improved isolation to be achieved with a single, standardized circuit board.

In accordance with another aspect of the invention, the circuit board can have electrically isolated surfaces with a first randomly meandering microstrip on one surface and a second microstrip on the second surface which is opposed to the first microstrip and follows a randomly meandering path which is a mirror image of the randomly meandering path of the first microstrip. This same arrangement of using mirror image randomly meandering paths can be applied to corresponding microstrips on adjacent circuit boards in the modular configuration.

BRIEF DESCRIPTION OF THE DRAWINGS

A full understanding of the invention can be gained from the following description of the preferred embodiments when read in conjunction with the accompanying drawings in which:

FIG. 1 is a plan view of a circuit board in accordance with the invention.

FIGS. 1a and 1b illustrate alternate configurations of impedance matching pads used on the circuit board of FIG. 1.

FIG. 2 illustrates a pair of parallel microstrips not laid out in accordance with the invention.

FIG. 3 illustrates a diverging pair of microstrips which is to be avoided.

FIG. 4 illustrates a layout of microstrips similar to that of FIG. 3 but in accordance with the invention.

FIG. 5 is a fractional sectional view through a circuit board illustrating another aspect of the invention taken along the line 5—5 in FIG. 6.

FIG. 6 is a fractional plan view of the circuit board of FIG. 5 illustrating a possible layout for a pair of microstrips on opposite surfaces of a printed circuit board in accordance with the invention.

DESCRIPTION OF THE PREFERRED EMBODIMENTS

Figure 1C:
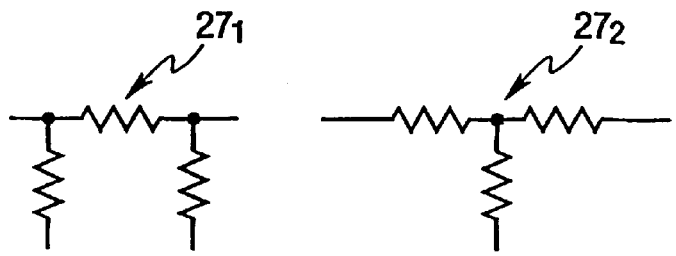
FIG. 1c is a fragmentary sectional view through the PCB of FIG. 1 taken along the line 1c–1c.
Figure 1C:
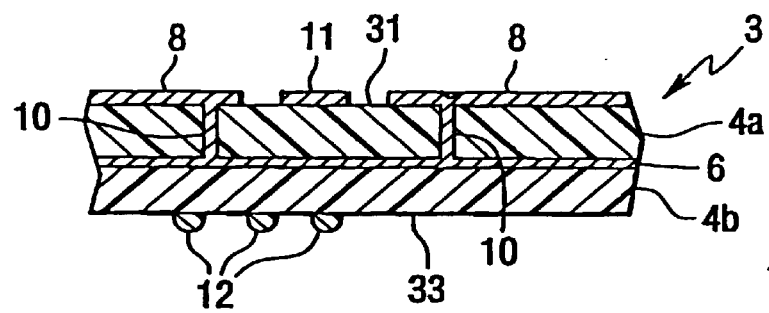

FIG. 1 illustrates a broadband RF circuit 1 in accordance with the invention which is part of a modular RF system of the type described in U.S. Pat. No. 5,481,073. It includes a substrate in the form of a printed circuit board (PCB) 3. Mounted on the PCB 3 are a number of circuit elements 5 which include input/output (I/O) connectors 7. The exemplary RF circuit 1 switches a signal applied to one first or input I/O connector $7_1$ to any one of 16 second or output I/O connectors $7_2$. The circuit elements 5 performing the switching function are branching elements in the form of (1*4) solid state switches $9_1$–$9_5$. A pattern of microstrips 11 interconnect the I/O connectors 7 and the switches 9 to form the branches 13 of the RF circuit 1. The signal input to the I/O connector $7_1$ is carried to the switch $9_1$ by the microstrip $11_1$. The switch $9_1$ can send the signal to any one of the switches $9_2$–$9_5$ via the microstrips $11_2$–$11_5$. Each of these switches can send the signal to any one of four of the I/O connectors $7_2$ over microstrips $11_{21}$–$11_{24}$, $11_{31}$–$11_{34}$, $11_{41}$–$11_{44}$, and $11_{51}$–$11_{54}$, respectively.

As can be seen from FIG. 1, the switches 9 and the microstrips 11 are laid out in a candelabra pattern so that each of the branch circuits from the input I/O connector $7_1$ to any of the output connectors $7_2$ contains the same number of switches (two) and the same number of microstrips (three) so that all of the branches are of substantially the same length. By substantially the same length it is meant that the difference in length is only a fraction of the wave length of the highest frequency carried by the circuit. It will be noticed that in the RF circuit 1, the microstrips $11_3$ and $11_4$ are shorter than the corresponding microstrips $11_2$ and $11_5$. However, this difference in length in this exemplary RF circuit is only about 7 cms which is less than half a wave length for an RF circuit in which the highest frequency is about 2 GHz having a wavelength of about 15 cms. If desired, the microstrips $11_3$ and $11_4$ can be lengthened to make them closer to the lengths of the microstrips $11_2$ and $11_5$ by extending them laterally and looping back to the respective switches. It will also be noticed that in the exemplary RF circuit, the lengths of the microstrips such as between the switch $9_2$ and the I/O connectors $7_2$ are not exactly the same length. However, the differences in their relative lengths are minor and the differences in total length of the respective branches from I/O connector $7_1$ to I/O connectors $7_2$ are insubstantial if these differences are less than about one-half wave length of the highest frequency carried by the circuit. This becomes more important when a total system is considered, where multiple switching systems have to be interconnected, such as occurs with an (n*M) matrix switching system.

As mentioned above, the solid state switches 9 aid in increasing the density of the branches on the PCB 3 by providing (1*4) switching, and at the same time provide much faster switching measured in nanoseconds compared to milliseconds for mechanical switches. That is, the solid state switches are about 1000 times faster than the mechanical switches. However, as also mentioned, the solid state switches do not provide the high isolation available with specialized mechanical switches (RF relays). In order to increase the isolation in the individual branches of the RF circuit, single or multiple serial spot switches $15_{21}$–$15_{54}$ are provided in each branch adjacent the output I/O connectors $7_2$. Operation of the serial switches 15 is coordinated with operation of the switches 9 so that they are all closed except the switch in series with the branch selected by the switches $9_2$–$9_5$. The serial switches 15 are terminated with resistors 17 when they are open circuit to establish the open circuit impedance for each of the connectors $7_2$. The serial switches 15 add an additional 20 dB of isolation for each additional serial switch to that provided by the switches 9 (depending on frequency and device selected).

In investigating ways of improving isolation in the RF circuit 1, it was realized that the traditional practice of laying out the microstrips in parallel straight lines or parallel arcuate sections which is the circuit layout commonly produced by CAD systems, leads to electromagnetic coupling between closely spaced microstrips. I have found that this unwanted cross-coupling can be significantly reduced by intentionally laying out the microstrips 11 in randomly meandering paths such that adjacent microstrips are non-parallel. By randomly meandering it is meant that they do not follow a regularly repetitive pattern and that the changes in direction are random both in an individual path and relative to adjacent paths. The paths also have a random relationship to the wavelengths of the RF signals carried. It can seen from FIG. 1 that the randomly meandering paths of the microstrips $11_{21}$–$11_{24}$ are repeated in $11_{31}$–$11_{54}$; however, the paths that are the same are made as widely spaced as possible and are not adjacent. The term non-parallel does not apply to just straight microstrip segments but also to meandering paths. Thus, as shown in FIG. 2, the two segments $19_1$ and $19_2$ do not meet the criteria as the two meandering microstrips are parallel and thus there could be unwanted cross-coupling between such microstrips.

In addition to cross coupling between adjacent straight microstrips, multiple microstrips carrying the same signal can form an antenna array which increases the radiation of the signal if they form a symmetrical pattern at any frequency within the broad frequency band of operation. Thus, as seen in FIG. 3, the two microstrips $21_1$ and $21_2$ which are parallel and then diverge at equal angles relative to a central axis 23, would form such an array and their radiation would increase if they carried a common signal. This effect can be reduced in accordance with the invention by laying out the microstrips $21_{12}$ and $21_{22}$ in randomly meandering paths as shown in FIG. 4.

Returning to FIG. 1, the circuit elements 5 of the RF circuit 1 may also include at least one amplifier 25 which provides gain to compensate for losses through the branch circuits. Typically, such an amplifier is placed at one end of a connecting line such as adjacent the input I/O connector $7_1$. Placing the amplifier 25 in about the middle of the microstrip $11_1$ breaks up this conductor into two shorter lengths. It is also known to attach additional impedance elements to a microstrip to provide matching. Again, such impedances are typically implemented by a single set of discrete components. Instead, the circuit 1 has impedance pads 27 distributed along the branch paths. These impedance pads may be for instance, the typical pi or T pads $27_1$ and $27_2$ shown in FIGS. 1a and 1b, respectively. These impedances make the microstrips lossy and therefore reduce radiated energy along the length of the microstrip. Additional isolation may be provided in the RF circuit 1 by shielding 29 shown in place over the amplifier 25. Additional shielding could be provided along sections of the microstrips as suggested in U.S. Pat. No. 5,481,073; however, the randomly meandering microstrip paths reduce the necessity for this. The entire PCB may also be shielded from adjacent PCBs which is a common practice.

In FIG. 1, all of the branch circuits are shown on one face of the printed circuit board 3 which is made up of two layers of dielectric material 4a and 4b (see FIG. 1c) with a ground plane 6 between. Surrounding but spaced from the microstrips 11 on the top surface 31 of the PCB 3 is a conductive layer 8 which is grounded through plated through holes 10 electrically connecting the layer 8 with the ground plane 6. Control leads 12 for the switches 9 are laid down on the bottom surface 33 of the PCB 3.

FIGS. 5 and 6 illustrate another aspect of the invention where microstrips $11_6$ and $11_7$ are provided on opposite faces 31 and 33 of a printed circuit board 3. The PCB 3 being a dielectric material provides electrical isolation between the two surfaces. As can be seen from the plan view of FIG. 6, the randomly meandering path $11_7$ is a mirror image of the randomly meandering path of the microstrip $11_6$. Thus, if these two microstrips are carrying the same signal, their fields at least partially cancel to reduce radiated energy. While not shown in FIGS. 5 and 6, ground planes would be spaced from the microstrips $11_6$ and $11_7$ either by air or additional dielectric layers (not shown).

Figure 7:
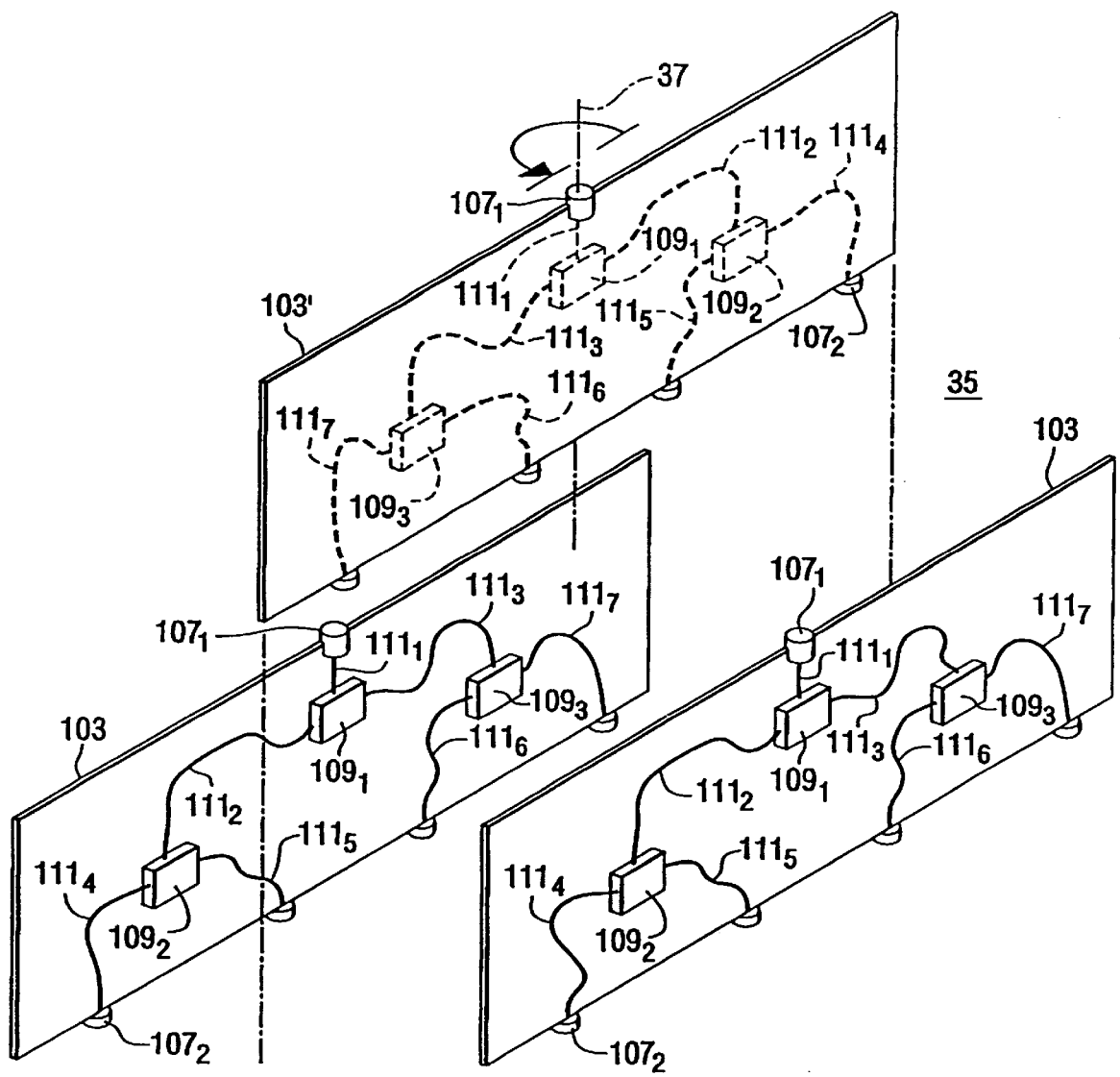
FIG. 7 is an isometric view, partially exploded, illustrating a simplified example of incorporation of the invention into a modular RF circuit.

As also described in U.S. Pat. No. 5,481,073, a modular RF circuit system can be constructed by mounting a number of the printed circuit boards 3 parallel to one another in regular spaced relation to form an array 35 such as is shown in FIG. 7. Where such arrangements are used in switching matrices in which the circuits on adjacent boards can carry the same signal, identically laid out microstrips on the parallel circuit boards could form multi-element antenna arrays which could increase the radiated energy. The use of the randomly meandering microstrips reduces this radiating of energy even in side-by-side board arrangements. However, to further reduce radiating of a common signal, the microstrips on adjacent boards can be differently randomly (or alternately on adjacent PCBs) meandering so that they are not parallel. This could be accomplished by individually randomly meandering each of the branches. Another solution, is illustrated in FIG. 7 where the layout of the RF circuits on the PCB 103 is generally symmetrical about a central axis 37 through the candelabra pattern but corresponding branches $111_2$ and $111_3$, $111_4$ and $111_5$, and $111_6$ and $111_7$ in the two halves of the circuit board 103 meander independently. Thus, the alternate circuit boards 103' can be rotated 180° so that none of the corresponding microstrips on adjacent boards are parallel yet all the boards are identical. The ground planes are not shown in FIG. 7 for clarity.

Figure 8:
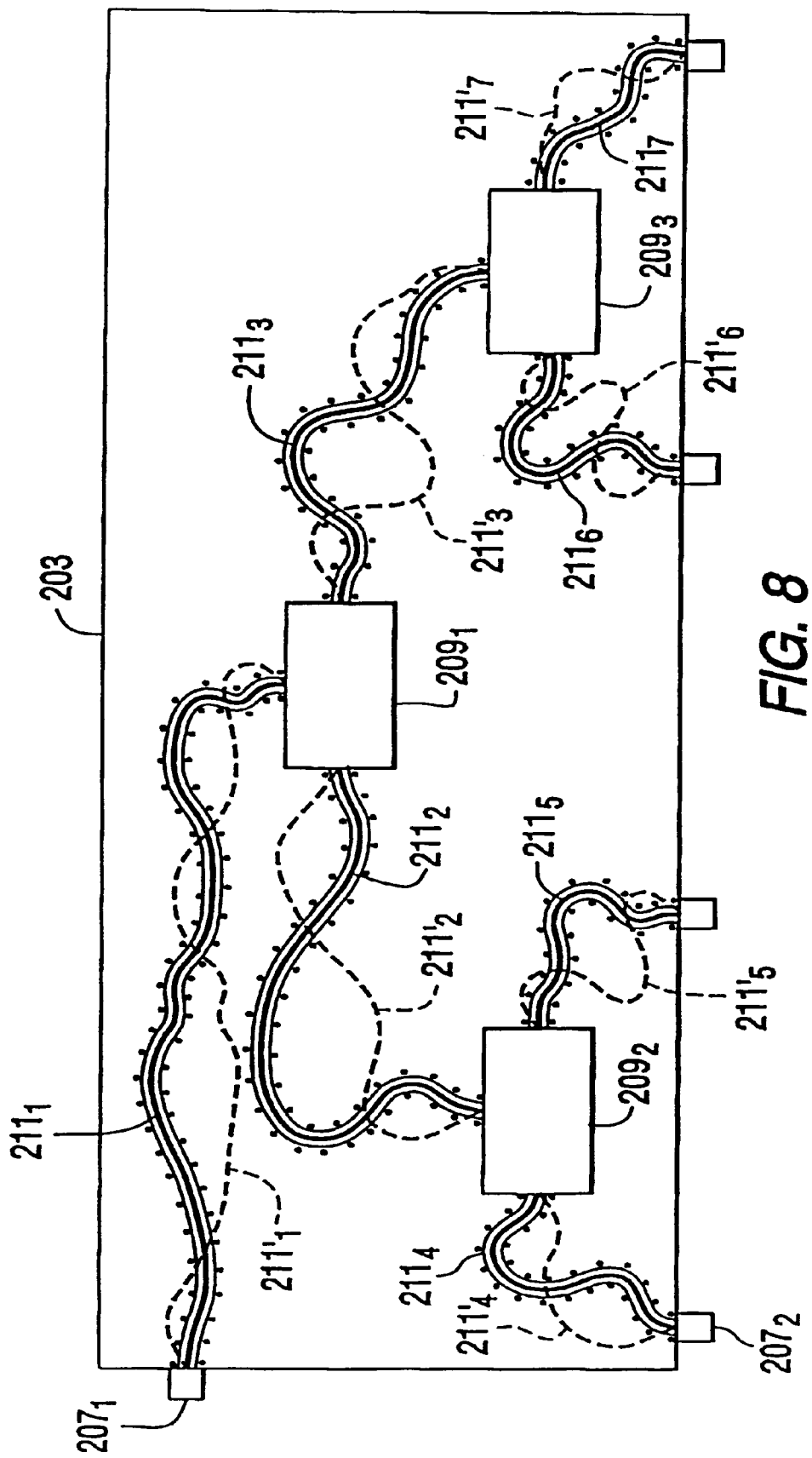
FIG. 8 is a plan view of another embodiment of circuit boards in accordance with the invention showing the circuits of one board in full line and the circuits of the companion board in dashed line.

FIG. 8 illustrates another arrangement for PCBs 203 wherein the microstrip $211_1$ extends from a connector $207_1$ on a side edge of the board so that rotating alternate boards 180° would result in the connectors $207_1$ being alternately on opposite side edges. Where it is desired that all the connectors $207_1$ be on the same side edge of the PCBs 203, two configurations of the board 203 are needed. The corresponding microstrips $211_1$–$211_7$ and $211'_1$–$211'_7$ in the two configurations are laid out as mirror images of each other. This arrangement is exaggerated in FIG. 8 for illustration of the concept and the grounded layer surrounding but spaced from the microstrips, such as the layer 8 in FIG. 1, is not shown for clarity.

Figure 9:
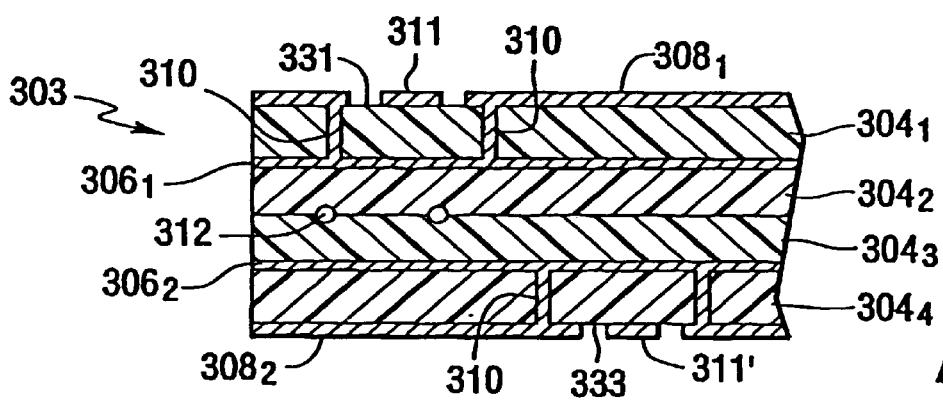
FIG. 9 is a fragmentary sectional view through a multilayer PCB incorporating the invention.

Alternatively, instead of having two separate PCBs with the microstrips 211 and 211' laid out in mirror image meandering paths on the two boards as in FIG. 8, a multi-layer PCB can be used with the microstrips 311 and 311'laid out in mirror image meandering paths on the two external faces 331 and 333 as shown in the sectional view of FIG. 9. The PCB 303 has four dielectric layers $304_1$–$304_4$ with a ground plane $306_1$ between first and second layers $304_1$, and $304_2$ and a ground plane $306_2$ between third and fourth dielectric layers $304_3$ and $304_4$. The conductive layers $308_1$ and $308_2$ cover the respective surfaces 331 and 333 of the PCB 303 and are spaced from the microstrips. Control leads 312 can be provided between dielectric layers $304_2$ and $304_3$. With this double faced arrangement, identical boards can be stacked side-by-side with minimum coupling or radiation (where adjacent boards carry the same signal) between corresponding microstrips.

Figure 10:
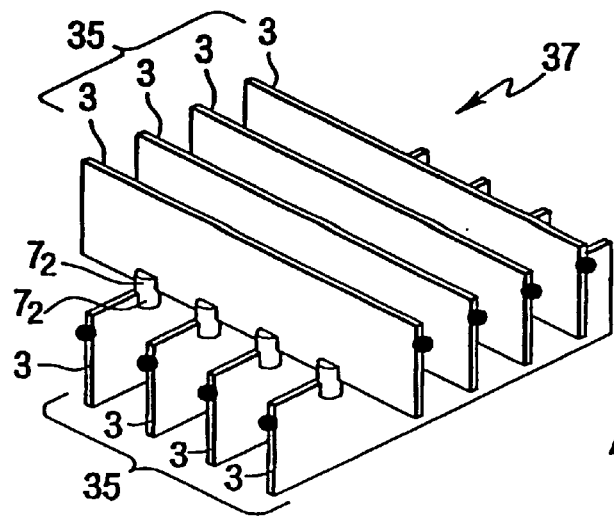
FIG. 10 illustrates a stack and tier arrangement of circuit boards in accordance with another aspect of the invention.

As shown in FIG. 10, multiple arrays 35 of PCBs 3 stacked in parallel planes can be arranged in crossed tiers 37 by connecting the second connectors $7_2$ of the boards in the two tiers. This provides a particularly powerful compact switching arrangement where n signals can be switched to any one of m outputs (4*4 in the example shown). The randomly meandering paths of microstrips in accordance with the invention reduce cross-talk and radiation, especially in the case of common signals in such systems. Also, this arrangement provides that all of the paths through the system are of substantially the same length.

The exemplary RF circuits are ideal for broadband RF routers and switching matrices. The invention can be applied to other RF circuits such as, for instance, the mother boards for digital processors where the operating frequencies are in the hundreds of MHz and evolving into the GHz range, and cellular telephone switching circuits using 900 and 1,800 MHz frequency bands.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A modular broadband RF circuit comprising: an array of parallel, spaced apart planar circuit boards each circuit board having a substantially similar number of substantially similar circuit elements mounted thereon in substantially similar locations, and each planar circuit board having a generally similar pattern of microstrips thereon connecting said circuit elements, said microstrips on each circuit board being laid out in randomly meandering paths wherein adjacent paths on a board are non-parallel and non-symmetrical about any common axis, said randomly meandering paths of corresponding microstrips on adjacent boards meander differently so they are not parallel to each other while the randomly meandering paths of said microstrips on alternate circuit boards are substantially identical.

2. A modular broadband RF circuit comprising: an array of parallel, spaced apart planar circuit boards each circuit board having a substantially similar number of substantially similar circuit elements mounted thereon in substantially similar locations, and each planar circuit board having generally similar pattern of microstrips thereon connecting said circuit elements, said microstrips on each circuit board being laid out in randomly meandering paths wherein adjacent paths on a board are non-parallel and non-symmetrical about any common axis, each circuit board having first and second electrically isolated surfaces on which are mounted a substantially similar number of substantially similar circuit elements in substantially similar locations connected by a generally similar pattern of microstrips; said microstrips on said first and second surfaces being laid out in differently randomly meandering paths so that corresponding paths on said first and second surfaces are non-parallel and wherein adjacent circuit boards in said array have opposite ones of said first and second surfaces facing one another.

3. A broadband RF circuit comprising:

a circuit board having four layers with first and second electrically isolated surfaces on first and fourth layers;

circuit elements including a substantially similar number of substantially similar circuit elements mounted in substantially similar locations on said first and second electrical isolated surfaces;

a generally similar pattern of microstrips connecting said circuit elements on said first and second electrically isolated surfaces and laid out in differently randomly meandering paths so that corresponding paths on the first and second electrically isolated surfaces are non-parallel:

control leads for said circuit elements located between second and third layers which in turn are positioned between said first and fourth layers; and ground planes between said first and second layers and between said third and fourth layers.

* * * * *